United States Patent
Wolff

(10) Patent No.: US 10,670,651 B2
(45) Date of Patent: Jun. 2, 2020

(54) DEVICE TESTING USING DUAL-FAN COOLING WITH AMBIENT AIR

(71) Applicant: Advantest Corporation, Tokyo (JP)

(72) Inventor: Roland Wolff, Santa Rosa, CA (US)

(73) Assignee: ADVANTEST CORPORATION, Tokyo (JP)

( * ) Notice: Subject to any disclaimer, the term of this patent is extended or adjusted under 35 U.S.C. 154(b) by 257 days.

(21) Appl. No.: 15/455,103

(22) Filed: Mar. 9, 2017

(65) Prior Publication Data

US 2018/0259573 A1    Sep. 13, 2018

(51) Int. Cl.
*G01R 31/28* (2006.01)
*G01R 1/04* (2006.01)

(52) U.S. Cl.
CPC ....... *G01R 31/2877* (2013.01); *G01R 1/0458* (2013.01); *G01R 31/2863* (2013.01); *G01R 31/2889* (2013.01)

(58) Field of Classification Search
CPC ............ G01R 31/2877; G01R 31/2889; G01R 1/0458
See application file for complete search history.

(56) References Cited

U.S. PATENT DOCUMENTS

| | | | |
|---|---|---|---|
| 5,126,656 A * | 6/1992 | Jones | G01R 31/2862 219/209 |
| 5,510,993 A | 4/1996 | Williams et al. | |
| 6,067,866 A | 5/2000 | Krajec et al. | |
| 6,794,887 B1 | 9/2004 | Nelson et al. | |
| 6,974,335 B1 | 12/2005 | Podpora | |
| 7,046,027 B2 | 5/2006 | Conner | |
| 7,084,659 B2 | 8/2006 | Delucco et al. | |
| 7,443,184 B2 | 10/2008 | Norris | |
| 7,532,023 B2 | 5/2009 | Norris | |
| 7,649,374 B2 | 1/2010 | Fishman et al. | |
| 7,810,006 B2 | 10/2010 | Yao et al. | |
| 7,848,106 B2 | 12/2010 | Merrow | |
| 8,102,173 B2 | 1/2012 | Merrow | |
| 8,117,480 B2 | 2/2012 | Merrow et al. | |
| 8,138,778 B1 * | 3/2012 | Smith | G01R 31/2822 324/756.02 |
| 8,350,191 B2 | 1/2013 | Ondricek | |
| 2003/0112025 A1 | 6/2003 | Hamilton et al. | |

(Continued)

FOREIGN PATENT DOCUMENTS

JP    S60143792    7/1985
JP    H04286968    10/1992

*Primary Examiner* — Akm Zakaria

(57) ABSTRACT

In one embodiment, a testing apparatus comprises: a modularized logic unit comprising circuitry for testing a plurality of devices under test (DUTs); a DUT interface board for physically and electrically interfacing with said modularized logic unit, said DUT interface board comprising: a loadboard comprising a plurality of sockets for receiving said plurality of DUTs; and a partial enclosure for partially enclosing said plurality of DUTs; a top fan disposed adjacent to a top of said partial enclosure; and a bottom fan disposed adjacent to a bottom of said partial enclosure, wherein the top fan and the bottom fan are operable to generate a vertical ambient air flow from the bottom fan to the top fan to cool said plurality of DUTs with exposed top and bottom sides, wherein the bottom fan is operable to draw ambient air from a surrounding environment.

18 Claims, 8 Drawing Sheets

(56) References Cited

U.S. PATENT DOCUMENTS

| | | |
|---|---|---|
| 2006/0197546 A1 | 9/2006 | Co et al. |
| 2007/0040569 A1 | 2/2007 | Gopal et al. |
| 2007/0159197 A1* | 7/2007 | Brueckner ............. G01R 31/01 324/754.08 |
| 2009/0262455 A1 | 10/2009 | Merrow |
| 2009/0265032 A1 | 10/2009 | Toscano et al. |
| 2010/0114379 A1* | 5/2010 | Sato ......................... F24F 1/38 700/275 |

* cited by examiner

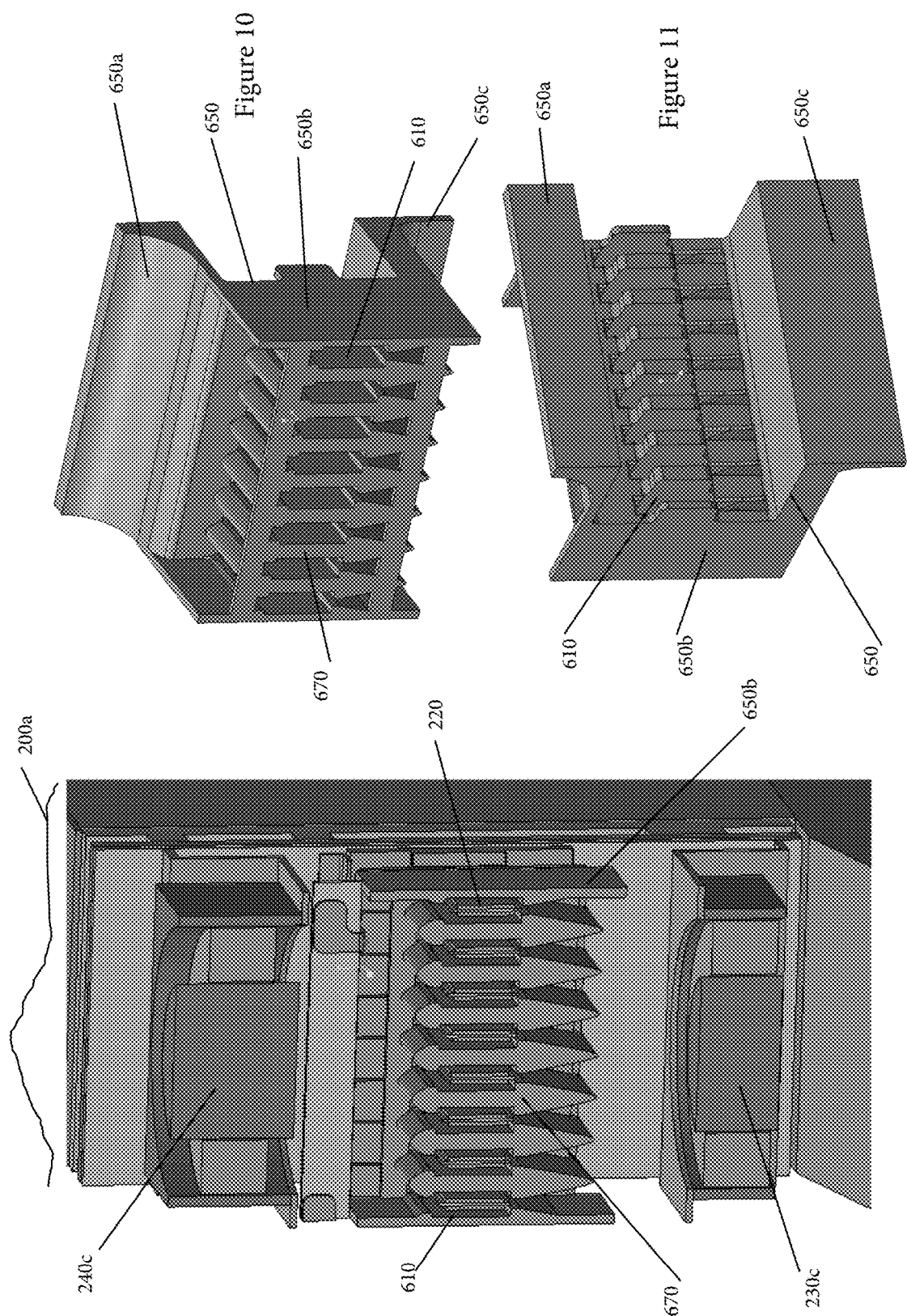

DEVICE TESTING USING DUAL-FAN COOLING WITH AMBIENT AIR

FIELD

Embodiments of the present invention relate to testing of devices. More specifically, embodiments relate to a cooling technique and system suitable for testing of devices, e.g., electronic devices.

BACKGROUND

The use of environmental testing chambers is prevalent in the testing of electronic devices. The environmental testing chamber provides controlled environmental conditions by utilizing various mechanisms to cool and/or to heat the air inside of the environmental testing chamber. However, some types of electronic devices do not require the testing to be performed under the tightly controlled environmental conditions offered by the environmental testing chamber. Generally, DUTs (devices under test) are placed inside the environmental testing chamber while test equipment is positioned outside the environmental testing chamber. This causes problems in that the DUTs can't be manipulated during testing because they are within the environmental testing chamber and not available. Also, the use of the environmental testing chamber is very expensive. Further, while the testing is going on, there is no way to add DUTs or remove DUTs because the entire lot typically needs to be tested at the same time inside the environmental testing chamber. Therefore, use of the expensive environmental testing chamber is not advantageous.

As the manufacturing phase of electronic devices matures to volume production, the testing phase is pressured to adapt new techniques that are more suitable for performing volume testing of electronic devices. Priorities of volume testing typically include cost, time, and automation.

SUMMARY

A new cooling technique suitable for testing devices is presented. The new cooling technique is a low cost cooling solution that utilizes ambient air and that is well suited for performing volume testing of DUTs (devices under test). Moreover, robotic manipulation of the DUTs is well compatible with the new cooling technique. Further, the need for environmental testing chambers is eliminated.

In accordance with embodiments of the present invention, device heating is generally produced by the devices operating themselves. Therefore, after allowing the devices to operate, they will achieve a set point temperature. Cooling methods and system employed within the embodiments of the present invention then effectively cool the devices so that they maintain their set point temperature for testing. Therefore, a temperature controlled environmental chamber is not required to heat the devices. Other advantages are that ambient air can be used successfully to cool the DUTs without needing additional cooling elements, aside from the fans. Therefore, the need for an expensive environmental chamber is eliminated. The solution is low cost and the DIB (DUT interface board) and test execution module (or primitive) combination lend themselves to robotic DUT manipulation and are therefore well suited for high volume testing of various electronic devices including, but not limited to, network cards, graphics cards, chips, microprocessors, hard disk drives (HDD), and solid state drives (SSD), etc. In addition, since the DUTs are not located within an environmental testing chamber, they are more readily handled, physically manipulated, inspected, etc., during the testing cycles. Aspects of the electronic circuitry used to test the DUTs are also modularized (using primitives, as described herein). Therefore, different modules can be performing different tests on different form factor and DUTs types. This increases overall test efficiency and test flexibility.

In one embodiment, a testing apparatus comprises: a modularized logic unit comprising circuitry for testing a plurality of devices under test (DUTs); a DUT interface board for physically and electrically interfacing with said modularized logic unit, said DUT interface board comprising: a loadboard comprising a plurality of sockets for receiving said plurality of DUTs; and a partial enclosure for partially enclosing said plurality of DUTs; a top fan disposed adjacent to a top of said partial enclosure; and a bottom fan disposed adjacent to a bottom of said partial enclosure, wherein the top fan and the bottom fan are operable to generate a vertical ambient air flow from the bottom fan to the top fan to cool said plurality of DUTs with exposed top and bottom sides, wherein the bottom fan is operable to draw ambient air from a surrounding environment.

Embodiments include the above and wherein said DUT interface board and said modularized logic unit comprise a modularized testing primitive and wherein further the modularized testing primitive is operable to be insertable into a rack slot of a multi-configurable rack.

Embodiments include the above and wherein said plurality of sockets are disposed between the top fan and the bottom fan and operable to receive and secure the plurality of DUTs, and further comprising an air conduit disposed adjacent to the top fan and operable to receive and release the vertical ambient air flow into a surrounding environment.

Embodiments include the above and further comprising: a plurality of air guides operable to control a direction of the vertical ambient air flow. Embodiments include the above and wherein the DUT interface board further comprises: a plurality of temperature sensors each associated with a respective one of the plurality of DUTs, wherein the plurality of temperature sensors are operable to control the top fan and the bottom fan.

Embodiments include the above and wherein the exposed top and bottom sides of the plurality of DUTs are vertically aligned with a direction of the vertical ambient air flow. Embodiments include the above and wherein the top fan is operable at a rotational speed that is greater than a rotational speed of the bottom fan for generation of the vertical ambient air flow. This improves the cooling effectiveness of the vertical ambient air flow and helps to prevent the escape of air from the vertical ambient air flow through a slot in the DUT interface board and outward into a face of an operator monitoring a robotic handler for insertion and/or removal of DUTs or manually handling the insertion and/or removal of DUTs from the DUT interface board via the slot.

Embodiments include the above and further comprising: a plurality of temperature sensors each associated with a respective one of the plurality of DUTs, wherein the plurality of temperature sensors are operable to sense a temperature the vertical ambient air flow; and a first controller coupled to the top fan and a second controller coupled to the bottom fan, wherein the first and second controllers are coupled to the plurality of temperature sensors and are operable to control operation of the top fan and the bottom fan until a set temperature point of the vertical ambient air flow is reached.

BRIEF DESCRIPTION OF THE DRAWINGS

The accompanying drawings, which are incorporated in and form a part of this specification, illustrate embodiments, together with the description, serve to explain the principles of the disclosure.

FIG. 9 illustrates a fourth cutaway view of a DIB (Device or DUT Interface Board) and a dual-fan cooling system with ambient air in accordance with a second embodiment.

FIG. 10 depicts a rear perspective view of the air flow guide structure shown in FIGS. 6-9 in accordance with a second embodiment.

FIG. 11 illustrates a front perspective view of the air flow guide structure shown in FIGS. 6-9 in accordance with a second embodiment.

DETAILED DESCRIPTION

Reference will now be made in detail to embodiments, examples of which are illustrated in the accompanying drawings. While the disclosure will be described in conjunction with these embodiments, it should be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description, numerous specific details are set forth in order to provide a thorough understanding. However, it will be recognized by one of ordinary skill in the art that embodiments may be practiced without these specific details.

One advantage of use of the dual-fan cooling with ambient air system is that the ambient air is efficiently and successfully implemented to cool the DUTs (devices under test) without needing additional cooling elements, aside from the fans. The need for an environmental chamber is eliminated as heat generated from the DUTs themselves is used to reach the testing temperature set point. The fans then maintain that set point. Further, dual-fan cooling with ambient air is low cost, compatible with robotic DUT (device under test) manipulation and well suited for volume testing of different types of devices (or DUTs) including, but not limited to, network cards, graphics cards, chips, microprocessors, hard disk drives (HDD), and solid state drives (SSD).

Figure 1:
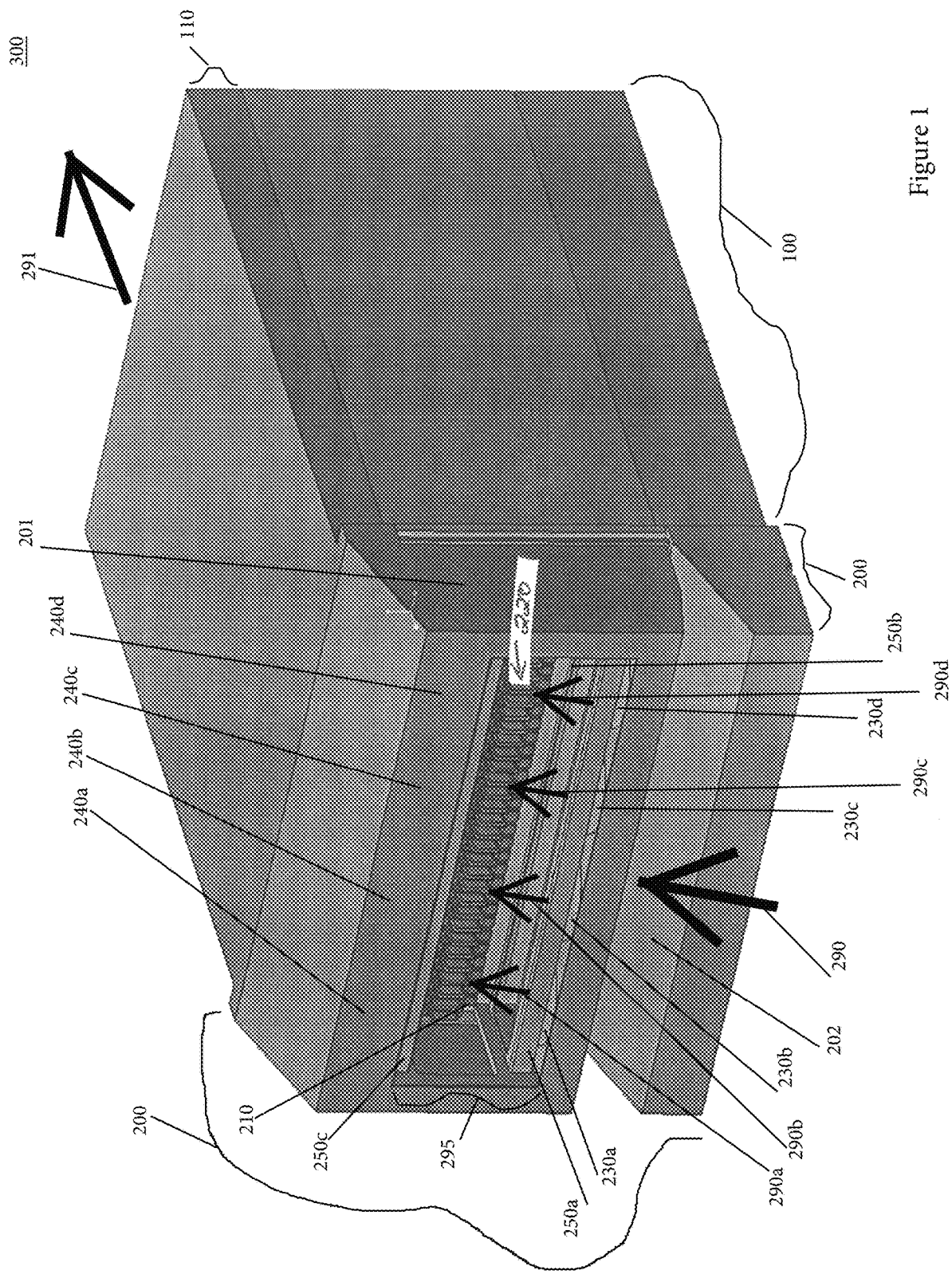
FIG. 1 depicts a perspective view of a DUT (device under test) modularized testing module that employs a dual-fan cooling system with ambient air in accordance with an embodiment.

FIG. 1 depicts a perspective view of a DUT (device under test) testing module 300 that employs dual-fan cooling with ambient air in accordance with an embodiment. It should be understood that the DUT testing module 300 is not limited to the illustration of FIG. 1. The testing module 300 is modularized and is capable of being inserted into a rack supporting a plurality of modules with communication and power signals carried from the back of the module to one or more central control computers or testing stations (not shown).

The DUT testing module 300 includes a DIB (DUT interface board) 200 and a test execution module (or primitive) 100 electrically coupled to the DIB 200. Further, the DUT testing module 300 is modular and the test execution module contains testing logic for testing the DUTs in the DIB 200. In this capacity, the testing logic supplies high speed communication and power. As described above, the primitive is modular, that is, individual DUT testing modules 300 may be inserted into respective rack slots to create a rack of customizable columns and rows in an ambient air environment (e.g., a testing floor or lab), eliminating the need for an environmental testing chamber.

Figure 2:
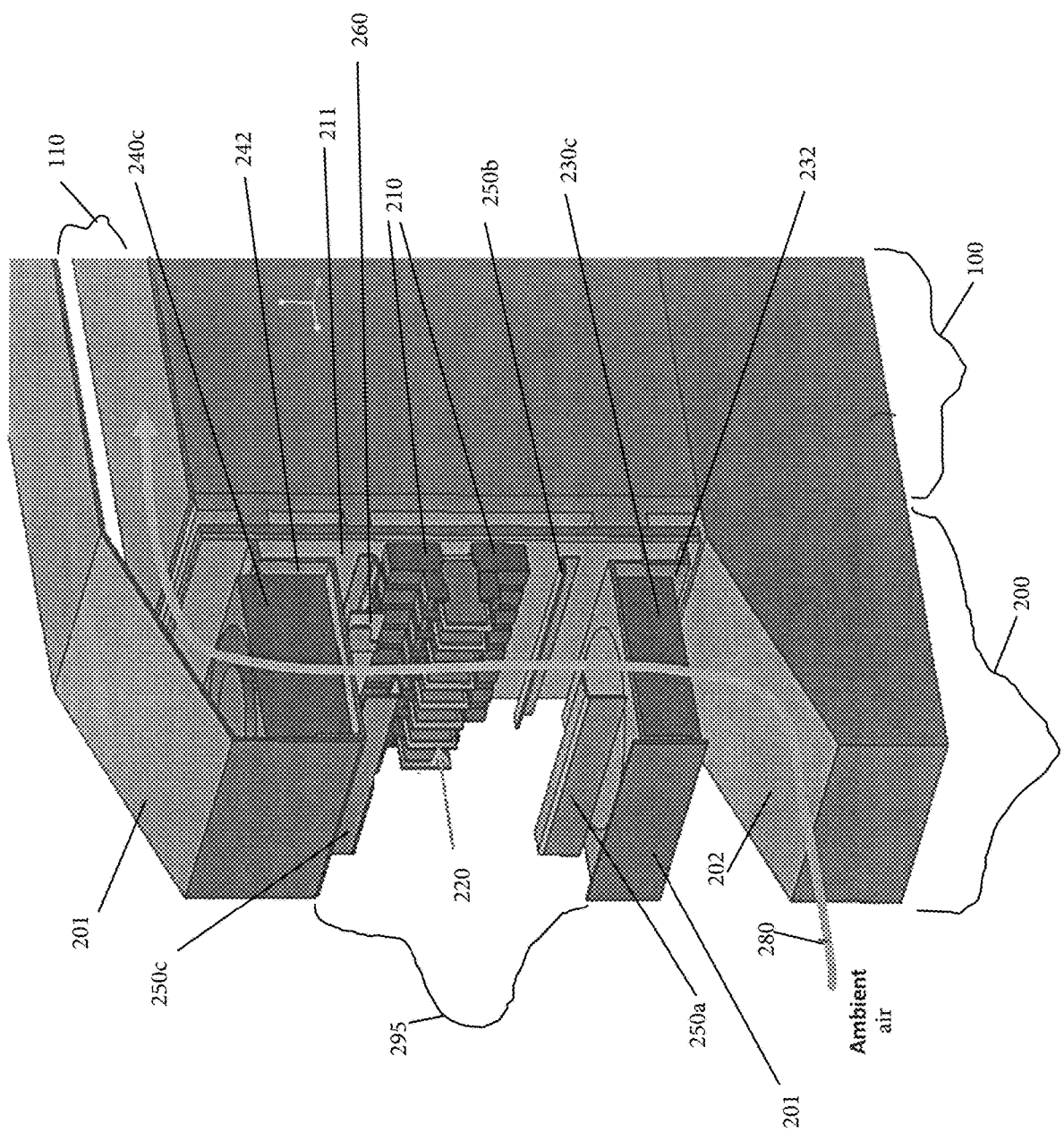
FIG. 2 shows a cutaway view of a DIB (Device or DUT Interface Board) and a dual-fan cooling system with ambient air of the DUT testing module of FIG. 1 in accordance with an embodiment.

The test execution module 100 is operable to perform the testing on a DUTs 220 by communicating power, instructions, signals, data, test results, and/or information with the DUT 220. The test execution module 100 includes processing, communication, and storage circuitry to conduct the test on the DUTs 220. Further, the test execution module 100 controls the cooling of the DUTs 220 by receiving input signals from temperature sensors 305 (FIG. 3) in the vicinity of the DUTs 220 and by adjusting the rotational speeds of the appropriate bottom fan 230a-230d and top fan 240a-240d (FIG. 1 and FIG. 2). Also, the test execution module 100 includes an air conduit 110 to release air flow 291 from the DIB 200 into the surrounding environment.

Continuing with FIG. 1, the DIB 200 is disposed in front of and is electrically coupled to the test execution module 100. The DIB 200 contains a partial enclosure, in that vents on the bottom and top allow air movement therein. Moreover, the DIB 200 includes a cover 201 (or housing), a slanted part 202, a slot 295, a plurality of sockets 210 to receive and secure the DUTs 220 via the slot 295, and a loadboard 211 (FIG. 2) on which the sockets 210 are securely attached. The sockets 210 are arranged into a row and physically and electrically connect to the DUTs. Also, the loadboard 211 (FIG. 2) electrically and physically interfaces with the test execution module 100 to support communication of power, instructions, signals, data, test results, and/or information between the DUT 220 and the test execution module 100. The load board, on one side that mates with the testing logic 100 has a universal connection layout that matches the testing logic 100 connection layout. On the other side, the load board comprises sockets 210 that are specific (physically and electrically) to a type of DUT being tested. The DIB 200 addresses the problems caused by the availability of numerous form factors and standards, such as M.2, U.2, SATA 2.5", etc. Instead of the test execution module 100 being designed to accommodate a specific form factor and/or standard, in this fashion multiple DIBs 200 are designed for each one of the various form factors and/or standards and are removable/replaceable from the test execution module 100.

Further, dual-fan cooling with ambient air is integrated into the DIB 200. The dual-fan cooling with ambient air includes bottom fans 230a-230d inside of the cover 201 of the DIB 200 and top fans 240a-240d inside of and obscured by the cover 201 of the DIB 200. The bottom fan 230c and the top fan 240c are visible in FIG. 2. In an embodiment, each bottom fan 230a-230d is vertically aligned with a respective top fan 240a-240d. Support structure 232 (FIG. 2) securely attaches bottom fans 230a-230d to the DIB 200. Similarly, support structure 242 (FIG. 2) securely attaches top fans 230a-230d to the DIB 200. The rotational speed of the bottom fans and the top fans can be separately adjustable.

Figure 3:
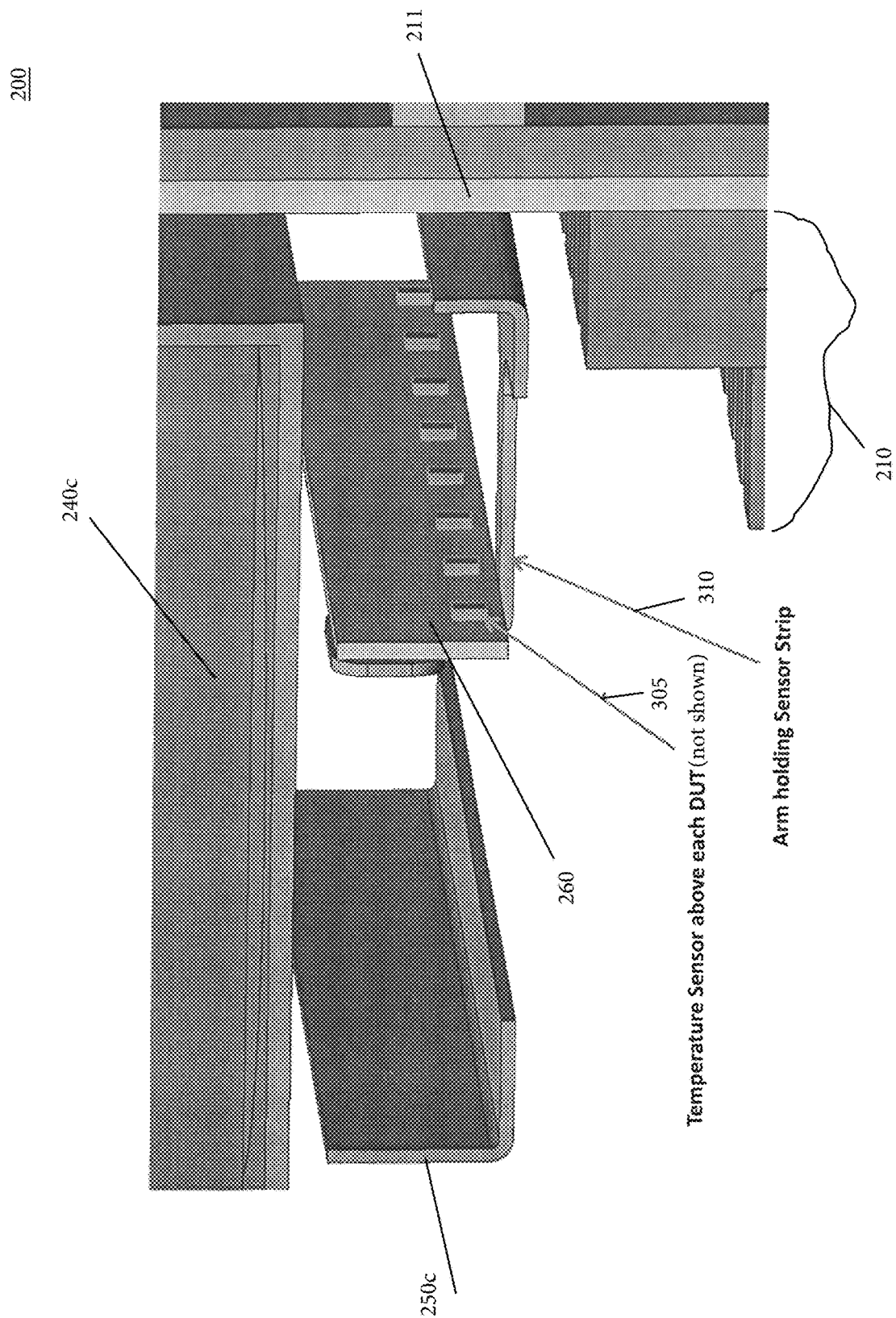
FIG. 3 illustrates an enlarged view of a portion of the cutaway view of FIG. 2 in accordance with an embodiment.

Continuing, the DIB 200 includes air guides 250a-250c (FIGS. 1 and 2) and a temperature sensor strip 260 (FIGS. 2 and 3) with a plurality of temperature sensors 305 (FIG. 3).

Referring again to the dual-fan cooling with ambient air of the DIB 200, The bottom fans 230a-230d are operable to draw ambient air 290 from the surrounding environment via a gap between the slanted part 202 (FIGS. 1 and 2) and the bottom fans 230a-230d.

The top fan 240a and the bottom fan 230a are operable to generate a vertical ambient air flow 290a from the bottom fan 230a to the top fan 240a to cool the plurality of DUTs 220 within the length and width dimensions of the top and bottom fans 240a and 230a. Also, the top fan 240b and the bottom fan 230b are operable to generate a vertical ambient air flow 290b from the bottom fan 230b to the top fan 240b to cool the plurality of DUTs 220 within the length and width dimensions of the top and bottom fans 240b and 230b. In addition, the top fan 240c and the bottom fan 230c are operable to generate a vertical ambient air flow 290c from the bottom fan 230c to the top fan 240c to cool the plurality of DUTs 220 within the length and width dimensions of the top and bottom fans 240c and 230c. Further, the top fan 240d and the bottom fan 230d are operable to generate a vertical ambient air flow 290d from the bottom fan 230d to the top fan 240d to cool the plurality of DUTs 220 within the length and width dimensions of the top and bottom fans 240d and 230d.

The air guides 250a-250c (FIGS. 1 and 2) are operable to control a direction of the vertical ambient air flow. The air guides 250a-250c (FIGS. 1 and 2) reduce ambient air loss through the slot 295 and assist in directing the vertical ambient air flow towards the top fans 240a-240d.

From the top fans 240a-240d, the air conduit 110 (FIGS. 1 and 2) adjacent to the top fans 240a-240d receives and releases the vertical ambient air flows 291 into the surrounding environment.

In an embodiment, the plurality of DUTs 220 have exposed top and bottom sides and can be arranged on a 13.3 mm pitch in one example. The vertical ambient air flows 290a-290d dissipate heat from the exposed top and bottom sides to cool the plurality of DUTs 220. The exposed top and bottom sides of the plurality of DUTs 220 are vertically aligned with a direction of the vertical ambient air flows 290a-290d to increase the cooling effect of the vertical ambient air flows 290a-290d on the plurality of DUTs 220.

FIG. 2 shows a cutaway view of the dual-fan cooling with ambient air of the DUT testing module 300 of FIG. 1 in accordance with an embodiment. One fan unit slice (top fan 240c and bottom fan 230c) is depicted in FIG. 2. The other three fan unit slices (top fan 240a and bottom fan 230a, top fan 240b and bottom fan 230b, and top fan 240d and bottom fan 230d) are similar in operation to the fan unit slice (top fan 240c and bottom fan 230c) shown in FIG. 2. It should be understood that the fan unit slice (top fan 240c and bottom fan 230c) of the DUT testing module 300 is not limited to the illustration of FIG. 2.

The path 280 of ambient air through the bottom fan 230c and top fan 240c of the DUT testing module 300 (FIG. 1) is illustrated. Initially, the bottom fan 230c draws ambient air from the surrounding environment via the gap between the slanted part 202 and the bottom fan 230c. Then, the bottom fan 230c directs the ambient air upward to the top fan 240c while concurrently the top fan 240c also directs the ambient air upwards. Thereafter, the ambient air is released via the air conduit 110 into the surrounding environment.

The vertical ambient air flow 290c (FIG. 1) from the bottom fan 230c and the top fan 240c benefits by the existence of a lower air pressure adjacent to the bottom of the top fan 240c relative to the air pressure down towards the bottom fan 230c. Air naturally flows from areas of higher air pressure to areas of lower air pressure.

In an embodiment, the lower air pressure adjacent to the bottom of the top fan 240c is achieved by operating the top fan 240c at a rotational speed that is greater than a rotational speed of the bottom fan 230c in generating the vertical ambient air flow 290c. This improves the cooling effectiveness of the vertical ambient air flow 290c and helps to prevent the escape of air from the vertical ambient air flow 290c through the slot 295 in the DIB 200 and outward into a face of an operator monitoring a robotic handler for insertion and/or removal of DUTs 220 or manually handling the insertion and/or removal of DUTs 220 from the DIB 200 via the slot 295. In an embodiment, the fan selected to be the top fan 240c has a maximum rotational speed greater than the maximum rotational speed of the fan selected to be the bottom fan 230c. Exemplary values for the maximum rotational speeds are 75 rps (revolutions per second) for the top fan 240c and 60 rps for the bottom fan 230c.

The volume and speed of the vertical ambient air flow 290c due to the top fan 240c and bottom fan 230c are factors in determining the range of temperatures in which the vertical ambient air flow 290c is sufficient to cool the DUTs 220 during testing. The rotational speeds of the top fan 240c and bottom fan 230c may be adjusted in accordance with the amount of cooling that is needed until a set point or desired temperature is reached with respect to the DUTs 220 during testing.

As depicted in FIG. 2, the sizes of top fan 240c and bottom fan 230c are sufficient for the vertical ambient air flow 290c (FIG. 1) to extend across eight DUTs 220 for providing the cooling effect. Exemplary values for the sizes are 92 mm×38 mm for the top fan 240c and 92 mm×25.4 mm for the bottom fan 230c, however, any suitable size can be employed. It is also possible to reduce the number of DUTs 220 to expand the range of temperatures in which the vertical ambient air flow 290c is sufficient to cool the DUTs 220 during testing.

FIG. 3 illustrates an enlarged view of a portion of the cutaway view of FIG. 2 in accordance with an embodiment. The top fan 240c, the air guide 250c, sockets 210 without DUTs, and the loadboard 211 of the DIB 200 are shown in FIG. 3. It should be understood that the enlarged view of the portion of the cutaway view is not limited to the illustration of FIG. 3.

As discussed above, the sensor strip 260 of the DIB 200 includes a plurality of temperature sensors 305 to sense the temperature of the adjacent DUTs. The DIB 200 further includes an arm 310 to securely hold the sensor strip 260. Each temperature sensor 305 is associated with and is positioned adjacent to a respective one of the plurality of DUTs 220 (not shown in FIG. 3), or may be assigned to a number of nearby DUTs. The temperature sensors 305 are operable to control the top fan 240c and the bottom fan 230c so that the DUTs can be maintained as a desired temperature during testing. For instance, the temperature sensors 305 provide temperature feedback to separate controllers 510a and 510b (FIG. 5) that independently control a slower rotational speed of the bottom fan 230c and a higher rotational speed of the top fan 240c as needed to maintain the DUTs 220 (not shown in FIG. 3) within an acceptable temperature range during testing. That is, the bottom fan 230c and the top fan 240c run at different rotational speeds relative to each other. Controllers 510a and 510b (FIG. 5) may be implemented in the test execution module 100 (FIG. 1).

Figure 4:
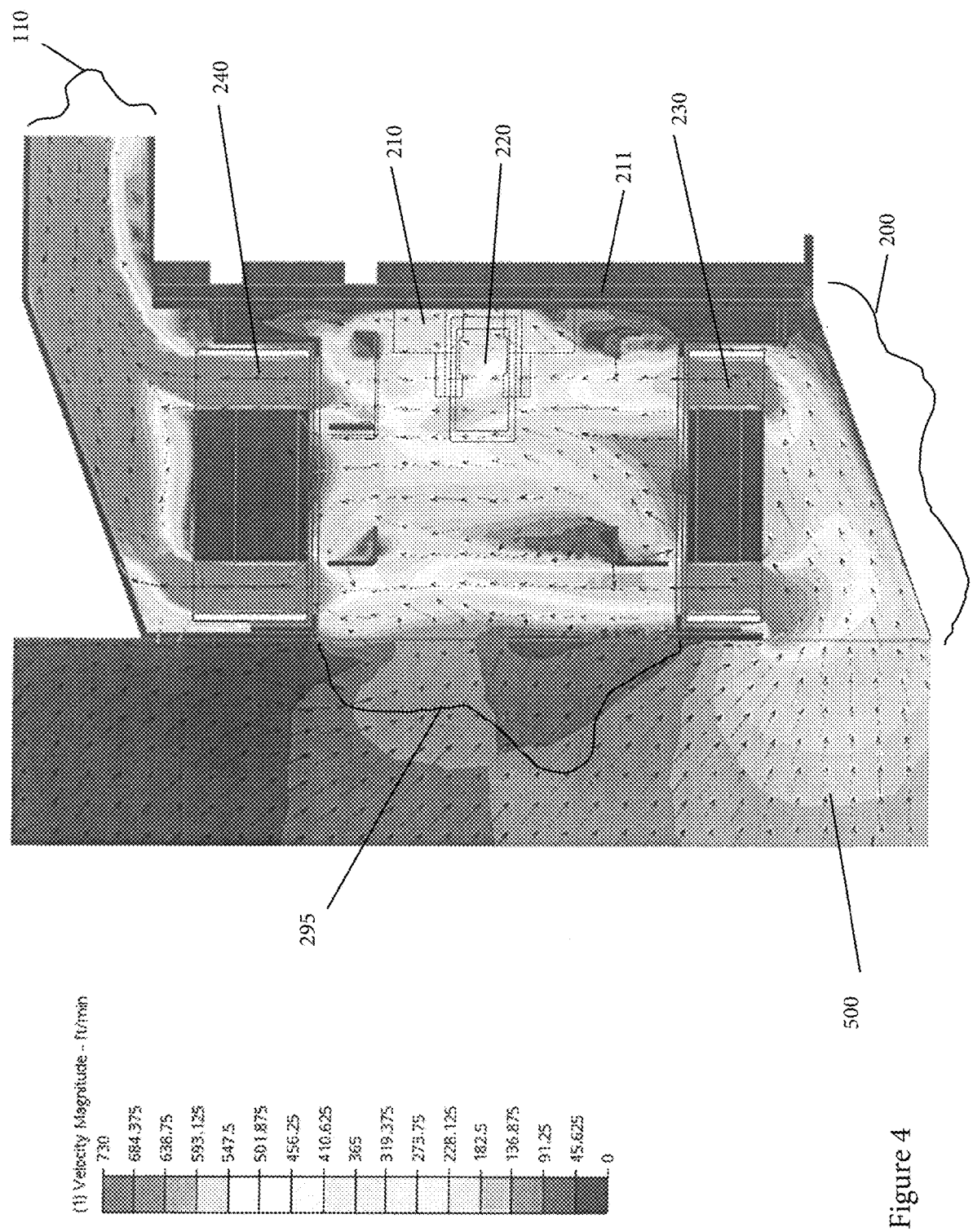
FIG. 4 depicts a simulation of a vertical ambient air flow of the dual-fan cooling with ambient air of the DUT testing module of FIG. 1 in accordance with an embodiment.

FIG. 4 depicts a simulation 500 of a vertical ambient air flow of the dual-fan cooling with ambient air of the DUT testing module 300 of FIG. 1 in accordance with an embodiment. The socket 210 with the DUT 220 inserted therein, the bottom fan 230, the top fan 240, the slot 295, and the loadboard 211 of the DIB 200 are depicted in FIG. 4. Also, the air conduit 110 is shown. The simulation 500 focuses on the velocity of the vertical ambient air flow during testing in the space/area between adjacent DUTs. It should be understood that the DIB 200 is not limited to the illustration of FIG. 4.

Figure 5:
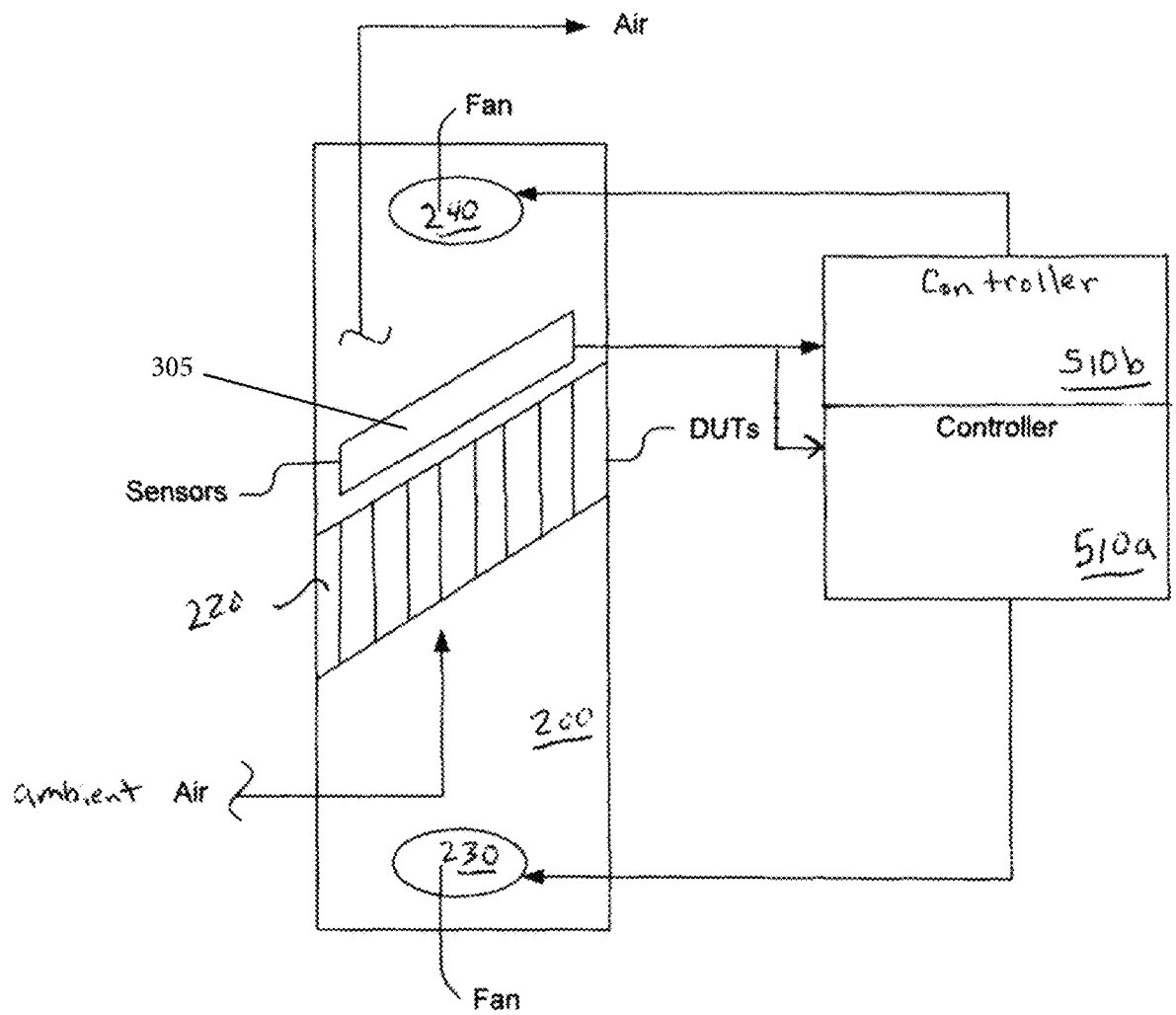
FIG. 5 depicts cooling control block diagram in accordance with an embodiment.

FIG. 5 depicts a cooling control system in accordance with an embodiment. The bottom fan 230, the top fan 240, and the temperature sensors 305 of the DIB 200 and the DUTs 220 are depicted in FIG. 5. Also, the controllers 510a and 510b are shown. The controllers 510a and 510b may be implemented in the test execution module 100 (FIG. 1). It should be understood that the cooling control is not limited to the illustration of FIG. 5.

During testing of the DUTs 220, the temperature sensors 305 measure the temperature in the vicinity of a respective DUT 220 or of a number of respective DUTs. The controllers 510a and 510b receive the measured temperatures as input signals. Thereafter, the controllers 510a and 510b independently determine whether the measured temperatures are within an acceptable temperature range. If the measured temperatures are outside the acceptable temperature range, the controller 510a sends a first control signal to the bottom fan 230 and the controller 510b sends a second control signal to the top fan 240. The controller 510a operates the bottom fan 230 at a slower rotational speed while the controller 510b operates the top fan 240 at a higher rotational speed. That is, the bottom fan 230 and the top fan 240 run at different rotational speeds relative to each other. The control signals adjust the rotational speeds of the bottom and top fans 230 and 240 as needed to change the temperature in the vicinity of the DUTs 220 to be within the acceptable temperature range.

Figure 6:
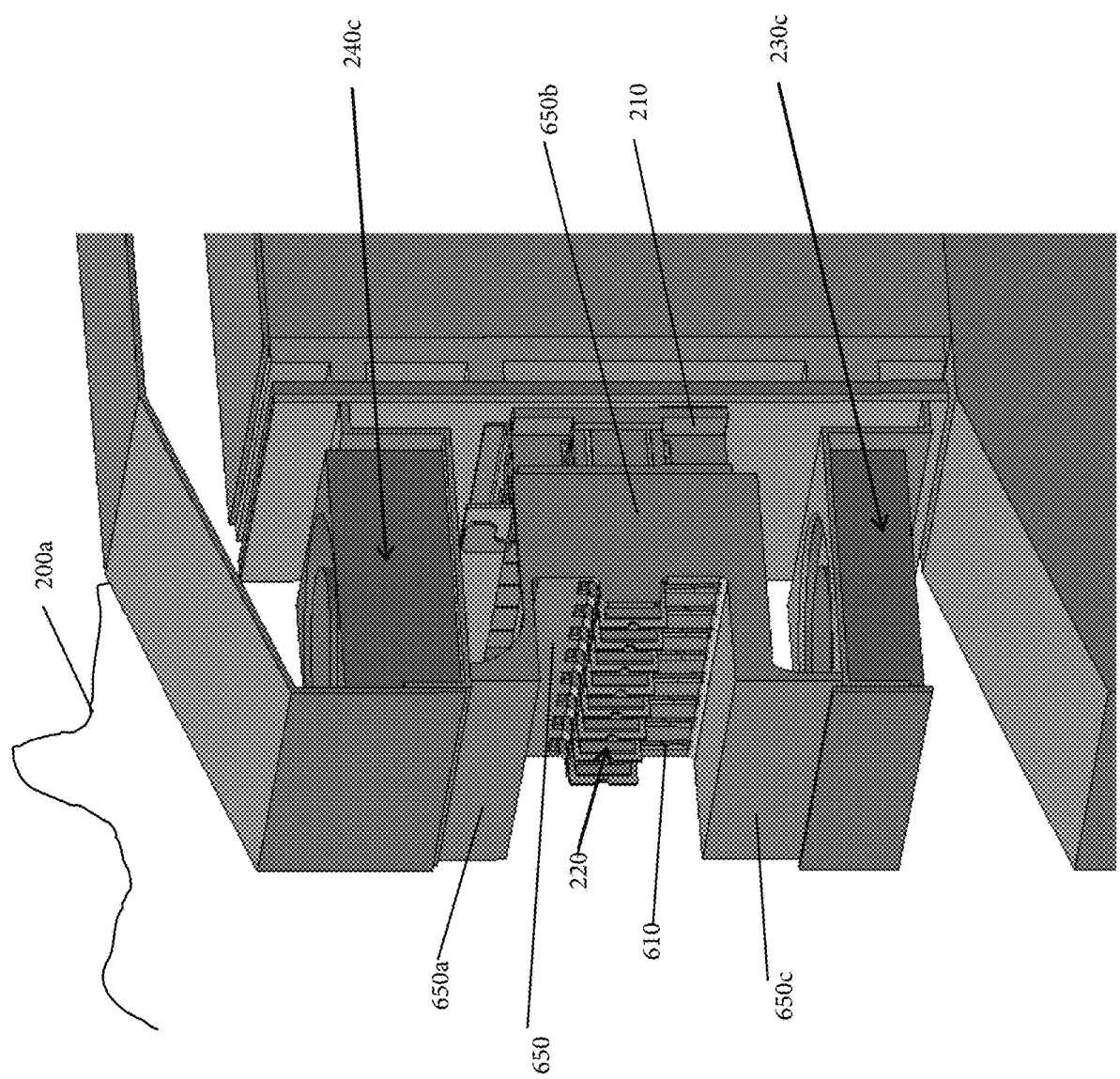
FIG. 6 shows a first cutaway view of a DIB (Device or DUT Interface Board) and a dual-fan cooling system with ambient air in accordance with a second embodiment.

FIG. 6 shows a first cutaway view of a DIB (Device or DUT Interface Board) 200a and a dual-fan cooling system with ambient air in accordance with a second embodiment. Except as discussed below, the description of the DIB 200 of FIGS. 1-5 is applicable to the DIB 200a. The sockets 210 with DUTs 220 inserted therein, the bottom fan 230c, and the top fan 240c of the DIB 200a are depicted in FIG. 6. Also, the DIB 200a includes an air flow guide structure 650, which is an alternative to the air guides 250a, 250b, and 250c shown in the DIB 200 of FIGS. 1-5. It should be understood that the DIB 200a is not limited to the illustration of FIG. 6.

The bottom fan 230c, the top fan 240c, and the air flow guide structure 650 operate cooperatively as a dual-fan cooling system to cool the DUTs 220 during testing in accordance with a second embodiment. The air flow guide structure 650 is positioned between the bottom fan 230c and the top fan 240c. Moreover, the air flow guide structure 650 expands the range of temperatures in which the bottom fan 230c and the top fan 240c are effective in dissipating the heat generated by the DUTs 220 during testing.

Referring to FIG. 6, the air flow guide structure 650 includes an upper air guide portion 650a that extends to the top fan 240c, a middle air guide portion 650b, and a lower air guide portion 650c that extends to the bottom fan 230c. The middle air guide portion 650b has a plurality of slot passages 610 that extend a length from a front side of the middle air guide portion 650b to a rear side of the middle air guide portion 650b. The slot passages 610 are arranged as a row and are aligned with a direction of the ambient air flow from the bottom fan 230c to the top fan 240c. The DUTs 220 are moved through the slot passages 610 to access the sockets 210 and enable the DUTs 220 to be inserted in the sockets 210. After being placed in their testing position, the DUTs 220 partially protrude outward from the slot passages 610 and the front side of the middle air guide portion 650b.

Figure 7:
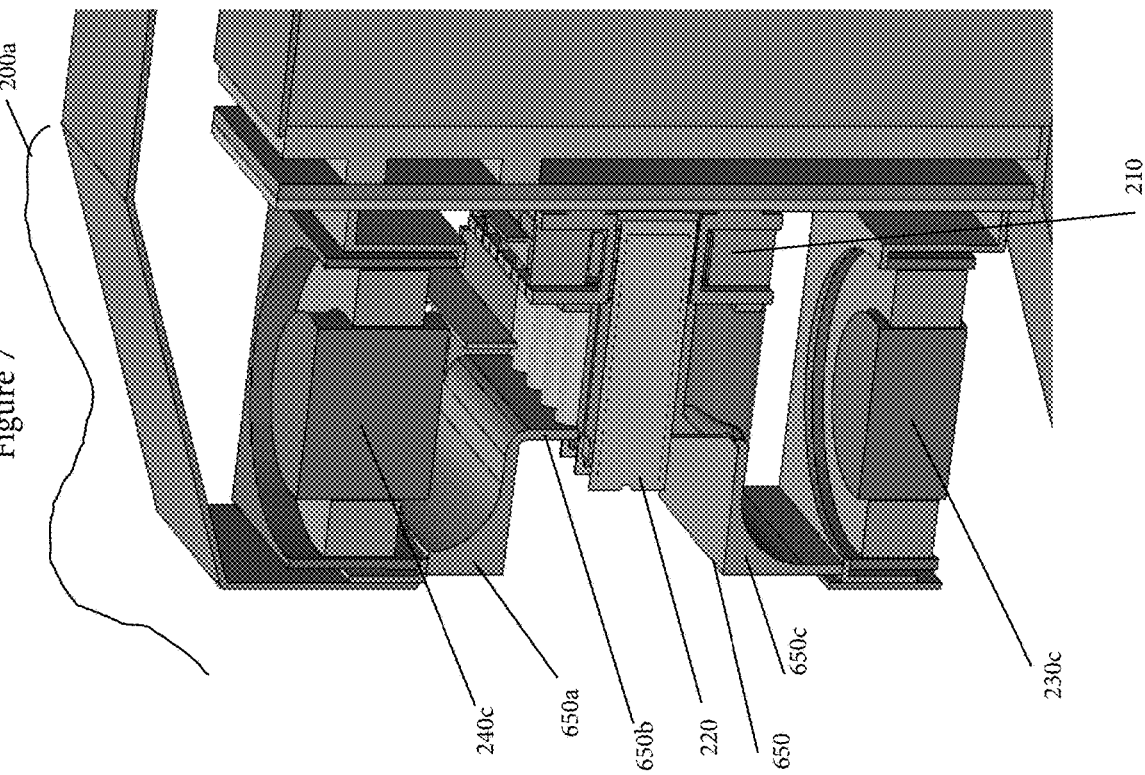
FIG. 7 illustrates a second cutaway view of a DIB (Device or DUT Interface Board) and a dual-fan cooling system with ambient air in accordance with a second embodiment.

FIG. 7 illustrates a second cutaway view of a DIB 200a and a dual-fan cooling system with ambient air in accordance with a second embodiment. Except as discussed below, the description of the DIB 200 of FIGS. 1-5 is applicable to the DIB 200a. The sockets 210 with DUTs 220 inserted therein, the bottom fan 230c, the top fan 240c, and the air flow guide structure 650 (including the upper air guide portion 650a, the middle air guide portion 650b, and the lower air guide portion 650c) of the DIB 200a are depicted in FIG. 7. It should be understood that the DIB 200a is not limited to the illustration of FIG. 7.

Continuing, the upper air guide portion 650a and the lower air guide portion 650c have interior curved surfaces. As the ambient air flow moves upward from the bottom fan 230c, the interior curved surface of the lower air guide portion 650c funnels the ambient air flow through a narrow bottom opening of the middle air guide portion 650b. After passing through the middle air guide portion 650b, the ambient air flow exits through a narrow top opening of the middle air guide portion 650b towards the top fan 240c. The interior curved surface of the upper air guide portion 650a spreads or widens the ambient air flow as it moves upward to the top fan 240c.

Figure 8:
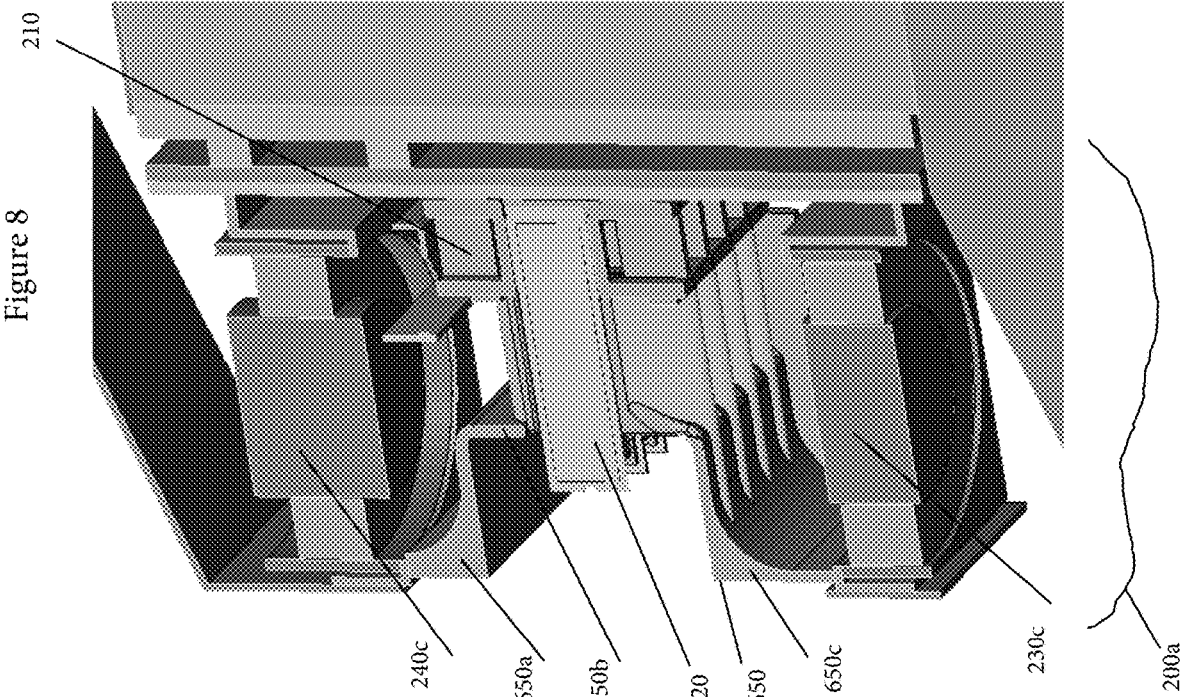
FIG. 8 depicts a third cutaway view of a DIB (Device or DUT Interface Board) and a dual-fan cooling system with ambient air in accordance with a second embodiment.

FIG. 8 depicts a third cutaway view of a DIB 200a and a dual-fan cooling system with ambient air in accordance with a second embodiment. Except as discussed below, the description of the DIB 200 of FIGS. 1-5 is applicable to the DIB 200a. The sockets 210 with DUTs 220 inserted therein, the bottom fan 230c, the top fan 240c, and the air flow guide structure 650 (including the upper air guide portion 650a, the middle air guide portion 650b, and the lower air guide portion 650c) of the DIB 200a are depicted in FIG. 8. It should be understood that the DIB 200a is not limited to the illustration of FIG. 8.

FIG. 9 illustrates a fourth cutaway view of a DIB 200a and a dual-fan cooling system with ambient air in accordance with a second embodiment, showing the middle air guide portion 650b in greater detail. Except as discussed below, the description of the DIB 200 of FIGS. 1-5 is applicable to the DIB 200a. The bottom fan 230c, the top fan 240c, the slot passages 610, and the middle air guide portion 650b of the DIB 200a and DUTs 220 are depicted in FIG. 9. It should be understood that the DIB 200a is not limited to the illustration of FIG. 9.

In FIG. 9, the front side of the middle air guide portion 650b is not shown. This provides an unobscured view of the interior of the middle air guide portion 650b. The slot passages 610 of the middle air guide portion 650b have opened bottoms and opened tops. Also, the slot passages 610 are spaced apart by aerodynamically shaped separators 670 that are designed to increase the speed of the ambient air flow adjacent to and/or in contact with the top and bottom sides of the DUTs 220. Consequently, the capacity of the ambient air flow to dissipate heat from the DUTs 220 is noticeably incremented by a factor. The aerodynamically shaped separator 670 includes an arrow-shaped end that faces the bottom fan 230c, a narrowed middle portion with opposite walls facing the top/bottom sides of adjacent DUTs 220, and a widened curved end that faces the top fan 240c.

As the ambient air flow moves upward from the bottom fan 230c, the ambient air flow passes through the narrow bottom opening (FIGS. 7 and 8) of the middle air guide portion 650b. The arrow-shaped ends of the aerodynamically shaped separators 670 direct the ambient air flow through the narrow opened bottoms of the slot passages 610. Thereafter, the narrowed middle portions of the aerodynamically shaped separators 670 provide sufficient spacing for the ambient air flow to split into two air flows to concurrently dissipate the heat of the top and bottom sides of the DUTs 220 in the slot passages 610. The two air flows continue to move upward in the slot passages 610 towards the top fan 240c. In the vicinity of the widened curved ends of the aerodynamically shaped separators 670, the two air flows in the slot passages 610 combine to form the ambient air flow that travels through the opened tops of the slot passages 610. The ambient air flow then exits through the narrow top opening (FIGS. 7 and 8) of the middle air guide portion 650b towards the top fan 240c.

FIG. 10 depicts a rear perspective view of the air flow guide structure 650 shown in FIGS. 6-9 in accordance with a second embodiment. The upper air guide portion 650a, the middle air guide portion 650b, the lower air guide portion 650c, the slot passages 610, and the aerodynamically shaped separators 670 of the air flow guide structure 650 are depicted in FIG. 10. It should be understood that the air flow guide structure 650 is not limited to the illustration of FIG. 10.

FIG. 11 illustrates a front perspective view of the air flow guide structure 650 shown in FIGS. 6-9 in accordance with a second embodiment. The upper air guide portion 650a, the middle air guide portion 650b, the lower air guide portion 650c, and the slot passages 610 of the air flow guide structure 650 are depicted in FIG. 11. It should be understood that the air flow guide structure 650 is not limited to the illustration of FIG. 11.

The foregoing descriptions of specific embodiments have been presented for purposes of illustration and description. They are not intended to be exhaustive or to limit the disclosure to the precise forms disclosed, and many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is intended that the scope of the disclosure be defined by the Claims appended hereto and their equivalents.

What is claimed is:

1. A testing apparatus, comprising:
   a modularized logic unit comprising circuitry for testing a plurality of devices under test (DUTs), wherein said circuitry for testing comprises circuits for communicating signals to said plurality of DUTs;
   a DUT interface board for physically and electrically interfacing with said modularized logic unit, wherein said DUT interface board is configured to be removable and replaceable with respect to said modularized logic unit, said DUT interface board comprising: a loadboard comprising a plurality of sockets for receiving said plurality of DUTs; and a partial enclosure for partially enclosing said plurality of DUTs, wherein said partial enclosure comprises openings disposed on a top of and on a bottom thereof;
   a top fan disposed adjacent to a top of said partial enclosure; and
   a bottom fan disposed adjacent to a bottom of said partial enclosure, wherein the top fan and the bottom fan are operable to generate a vertical ambient air flow from the bottom fan to the top fan drawing air from said bottom opening to said top opening of the partial enclosure to cool said plurality of DUTs with exposed top and bottom sides, wherein the bottom fan is operable to draw ambient air from a surrounding environment; and
   wherein said partial enclosure further comprises a slot disposed adjacent to said plurality of DUTs and operable to allow insertion and removal of said plurality of DUTs therethrough with respect to said plurality of sockets and wherein further said slot is open to said ambient air.

2. The testing apparatus of claim 1, wherein said DUT interface board and said modularized logic unit comprise a modularized testing primitive and wherein further the modularized testing primitive is operable to be insertable into a rack slot of a multi-configurable rack.

3. The testing apparatus of claim 1, wherein said plurality of sockets are disposed between the top fan and the bottom fan and operable to receive and secure the plurality of DUTs, and further comprising an air conduit disposed adjacent to the top fan and operable to receive and release the vertical ambient air flow into a surrounding environment.

4. The testing apparatus of claim 3, further comprising:
   a plurality of air guides operable to control a direction of the vertical ambient air flow.

5. The testing apparatus of claim 1, wherein the DUT interface board further comprises:
   a plurality of temperature sensors each associated with a respective one of the plurality of DUTs, wherein the plurality of temperature sensors are operable to control the top fan and the bottom fan.

6. The testing apparatus of claim 1, wherein the exposed top and bottom sides of the plurality of DUTs are vertically aligned with a direction of the vertical ambient air flow.

7. The testing apparatus of claim 1, wherein the top fan is operable at a rotational speed that is greater than a rotational speed of the bottom fan for generation of the vertical ambient air flow.

8. A testing apparatus, comprising:
   a device under test (DUT) interface board comprising a partial enclosure, said partial enclosure comprising openings disposed at a top and a bottom thereof;
   a top fan disposed within a top region of said partial enclosure;
   a bottom fan disposed within a bottom region of said partial enclosure;
   a modularized logic unit comprising circuitry for testing a plurality of devices under test (DUTs), wherein said circuitry for testing comprises circuits for communicating signals to said plurality of DUTs;

wherein the DUT interface board is operable for physically and electrically interfacing with said modularized logic unit, wherein said DUT interface board is further configured to be removable and replaceable with respect to said modularized logic unit, said DUT interface board further comprising: a loadboard comprising a plurality of sockets; wherein said plurality of sockets are disposed between the top fan and the bottom fan and operable to receive and secure said plurality of DUTs, wherein the top fan and the bottom fan are operable to generate a vertical ambient air flow from the bottom fan to the top fan, within said partial enclosure, to cool the plurality of DUTs, wherein the bottom fan is operable to draw ambient air from a surrounding environment and wherein said partial enclosure is operable to surround said plurality of DUTs; and wherein said partial enclosure further comprises a slot disposed adjacent to said plurality of DUTs and operable to allow insertion and removal of said plurality of DUTs therethrough with respect to said plurality of sockets and wherein further said slot is open to said ambient air.

9. The testing apparatus of claim 8, further comprising:
a plurality of air guides operable to control a direction of the vertical ambient air flow; and
an air conduit adjacent to the top fan and operable to receive and release the vertical ambient air flow into a surrounding environment.

10. The testing apparatus of claim 8, further comprising:
a plurality of temperature sensors each associated with a respective one of the plurality of DUTs, wherein the plurality of temperature sensors are operable to control the top fan and the bottom fan and wherein further said plurality of temperature sensors are disposed within said partial enclosure.

11. The testing apparatus of claim 8, wherein top and bottom sides of the plurality of DUTs are vertically aligned with a direction of the vertical ambient air flow within said partial enclosure.

12. The testing apparatus of claim 8, wherein the top fan is operable at a rotational speed that is greater than a rotational speed of the bottom fan for generation of the vertical ambient air flow.

13. A testing apparatus, comprising:
a top fan;
a bottom fan vertically aligned with the top fan, wherein the top fan and the bottom fan are operable to generate a vertical ambient air flow from the bottom fan to the top fan to cool a plurality of DUTs (devices under test), wherein the top fan is operable at a rotational speed that is greater than a rotational speed of the bottom fan for generation of the vertical ambient air flow, and wherein the bottom fan is operable to draw ambient air from a surrounding environment; and
a modularized logic unit comprising circuitry for testing the plurality of DUTs, wherein said circuitry for testing comprises circuits for communicating signals to said plurality of DUTs; and
a DUT interface board for physically and electrically interfacing with said modularized logic unit, wherein said DUT interface board is configured to be removable and replaceable with respect to said modularized logic unit, said DUT interface board comprising: a loadboard comprising a plurality of sockets or receiving said plurality of DUTs; and partial enclosure for partially enclosing said plurality of DUTs;

wherein said partial enclosure comprises openings at a top and a bottom thereof and wherein said top fan is disposed at said top opening and wherein said bottom fan is disposed at said bottom opening and wherein said vertical ambient air flow is operable to flow within said partial enclosure; and wherein said partial enclosure further comprises a slot disposed adjacent to said plurality of DUTs and operable to allow insertion and removal of said plurality of DUTs therethrough with respect to said plurality of sockets and wherein further said slot is open to said ambient air.

14. The testing apparatus of claim 13, further comprising:
an air conduit adjacent to the top fan and operable to receive and release the vertical ambient air flow into a surrounding environment.

15. The testing apparatus of claim 14, further comprising:
a plurality of air guides operable to control a direction of the vertical ambient air flow.

16. The testing apparatus of claim 14, further comprising:
a plurality of temperature sensors each associated with a respective one of the plurality of DUTs, wherein the plurality of temperature sensors are operable to sense a temperature the vertical ambient air flow; and
a first controller coupled to the top fan and a second controller coupled to the bottom fan, wherein the first and second controllers are coupled to the plurality of temperature sensors and are operable to control operation of the top fan and the bottom fan until a set temperature point of the vertical ambient air flow is reached.

17. The testing apparatus of claim 16, wherein top and bottom sides of the plurality of DUTs are vertically aligned with a direction of the vertical ambient air flow.

18. The testing apparatus of claim 13, further comprising:
an air conduit adjacent to the top fan and operable to receive and release the vertical ambient air flow into a surrounding environment.

* * * * *